US010971882B2

(12) United States Patent
Aruga

(10) Patent No.: US 10,971,882 B2
(45) Date of Patent: Apr. 6, 2021

(54) LIGHT SOURCE MODULE

(71) Applicant: NICHIA CORPORATION, Anan (JP)

(72) Inventor: Takanori Aruga, Suwa-gun (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/425,757

(22) Filed: May 29, 2019

(65) Prior Publication Data

US 2019/0372295 A1 Dec. 5, 2019

(30) Foreign Application Priority Data

May 30, 2018 (JP) .............................. JP2018-103149

(51) Int. Cl.
*H01S 3/00* (2006.01)
*F21V 5/00* (2018.01)
*F21V 5/04* (2006.01)

(52) U.S. Cl.
CPC ............ *H01S 3/0064* (2013.01); *F21V 5/008* (2013.01); *F21V 5/043* (2013.01)

(58) Field of Classification Search
CPC .... H01S 3/0064; H01S 5/4087; H01S 5/4012; H01S 5/005; F21V 5/008; F21V 5/043; G03B 21/2013; G03B 21/208; G02B 19/0057; G02B 19/0014; G02B 27/00
See application file for complete search history.

(56) References Cited

U.S. PATENT DOCUMENTS

| 6,064,528 | A | * | 5/2000 | Simpson, Jr. ............ B41J 2/451 355/40 |
| 8,596,823 | B2 | * | 12/2013 | Kuchibhotla ...... G02B 27/0961 362/259 |
| 9,983,471 | B1 | * | 5/2018 | Lin ...................... H04N 9/3114 |

(Continued)

FOREIGN PATENT DOCUMENTS

| JP | 2002-151799 A | | 5/2002 |
| JP | 2002-208159 A | | 7/2002 |
| JP | 2003121780 A | * | 4/2003 |

OTHER PUBLICATIONS

Machine English Translation of JP2003121780; Kitazawa, Tazuko (Year: 2003).*

*Primary Examiner* — Rajarshi Chakraborty
*Assistant Examiner* — Glenn D Zimmerman
(74) *Attorney, Agent, or Firm* — Birch, Stewart, Kolasch & Birch, LLP

(57) ABSTRACT

A light source module includes a light source configured to emit a first light beam, a first optical element having a first surface on which the first light beam is incident along a first direction, the first surface including a first region on which at least a portion of the first light beam is incident, and a second surface from which the first light beam is emitted, and a second optical element on which the first light beam having emitted from the first optical element is incident. The first light beam has a first width along a second direction and a second width along a third direction. The first width is greater than the second width. The first region has a pro- (Continued)

truding shape in a first cutting plane including the first and second directions, and has a recessed shape in a second cutting plane including the first and third directions. The second surface has a protruding shape in the first and second cutting planes.

20 Claims, 9 Drawing Sheets

(56) References Cited

U.S. PATENT DOCUMENTS

| | | | | |
|---|---|---|---|---|
| 2001/0028506 | A1* | 10/2001 | Fujimoto | H04N 1/0318 |
| | | | | 359/622 |
| 2012/0154895 | A1* | 6/2012 | Muenz | B23K 26/0006 |
| | | | | 359/285 |
| 2016/0087399 | A1* | 3/2016 | Horn | H01S 5/02236 |
| | | | | 372/50.121 |
| 2018/0348451 | A1* | 12/2018 | Yamamoto | H01S 5/105 |
| 2019/0041028 | A1* | 2/2019 | Bremerich | F21V 5/007 |

* cited by examiner

LIGHT SOURCE MODULE

CROSS-REFERENCE TO RELATED APPLICATION

This application claims priority to Japanese Patent Application No. 2018-103149, filed on May 30, 2018, the contents of which are hereby incorporated by reference in their entirety.

BACKGROUND OF THE INVENTION

1. Field of the Invention

The present disclosure relates to a light source module.

2. Description of Related Art

Light source modules are used in projectors and the like. A light source module is desired to have a uniform light intensity distribution (for example, see Japanese Unexamined Patent Application Publication No. 2002-151799).

SUMMARY OF THE INVENTION

Certain embodiments of the present invention provides a light source module having a uniform light intensity distribution.

According to one embodiment of the present invention, a light source module includes a light source part configured to emit a first light beam, a first optical element having a first surface on which the first light beam is incident along a first direction, the first surface including a first region on which at least a portion of the first light beam is incident, and a second surface from which the first light beam is emitted, and a second optical element having a first end on which the first light beam having been emitted from the first optical element is incident. The first light beam has a first width along a second direction intersecting the first direction on the first surface, and a second width along a third direction intersecting a plane including the first direction and the second direction on the first surface. The first width is greater than the second width. The first region has a protruding shape in a first cutting plane including the first direction and the second direction, and has a recessed shape in a second cutting plane including the first direction and the third direction. The second surface has a protruding shape in the first cutting plane and in the second cutting plane.

According to certain embodiments of the present invention, a light source module having a uniform light intensity distribution can be provided.

DETAILED DESCRIPTION OF EMBODIMENTS

Figure 1:
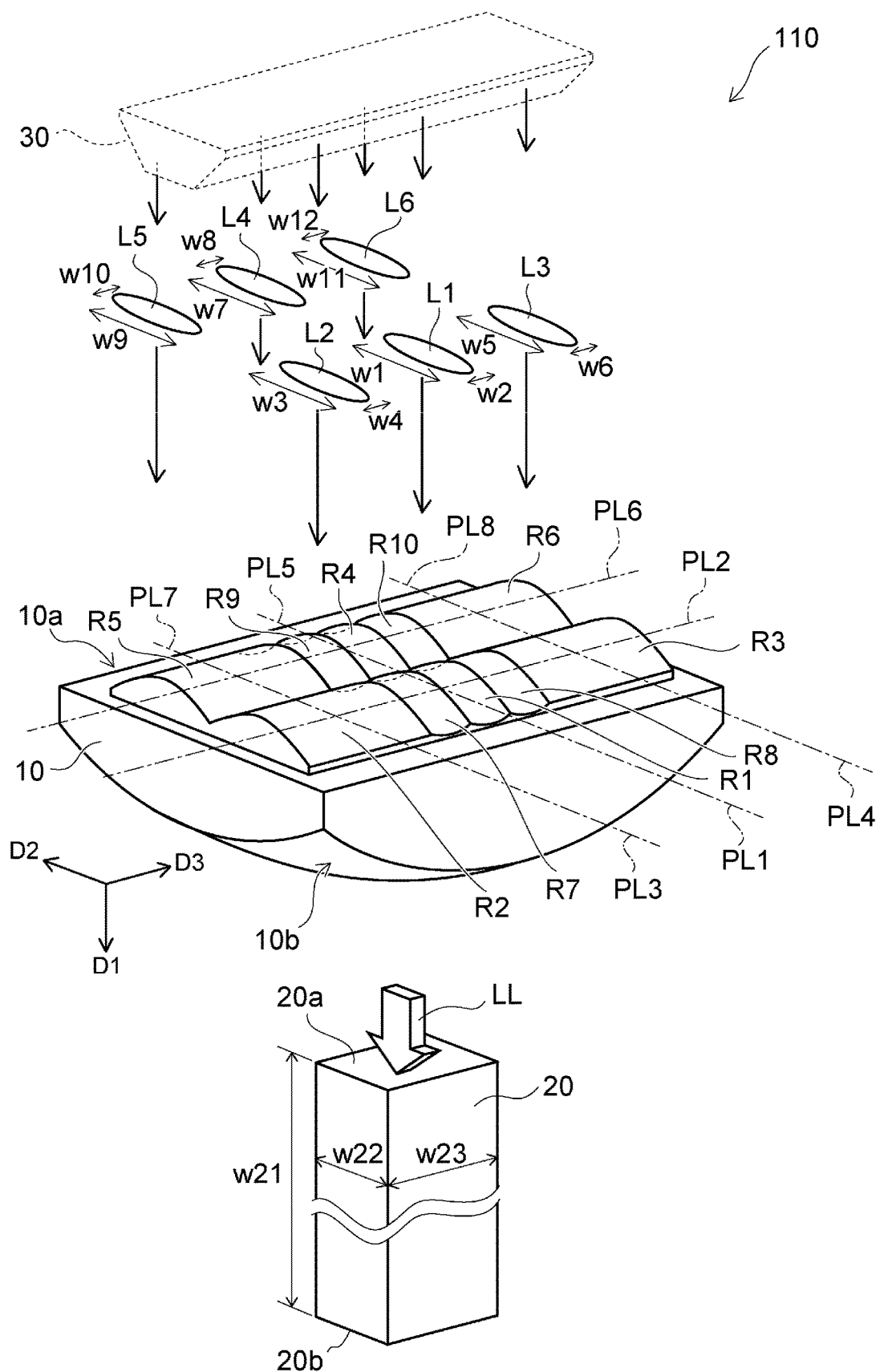
FIG. 1 is a schematic diagram showing an example of a light source module according to a first embodiment.

Certain embodiments of the present invention will be described below referring to the accompanying drawings.

The drawings are schematic or conceptual, and the relationship between a thickness and a width of each component, the ratio between sizes of components, etc., of the drawings may not be the same as those of an actual product. Also, the dimensions and ratios of the same component in different drawings may be different from each other.

In the specification of the present application, an element that is the same as that described in a drawing that has been referred to is indicated with the same reference numeral, and its detailed description is omitted as appropriate.

First Embodiment

Figure 2:
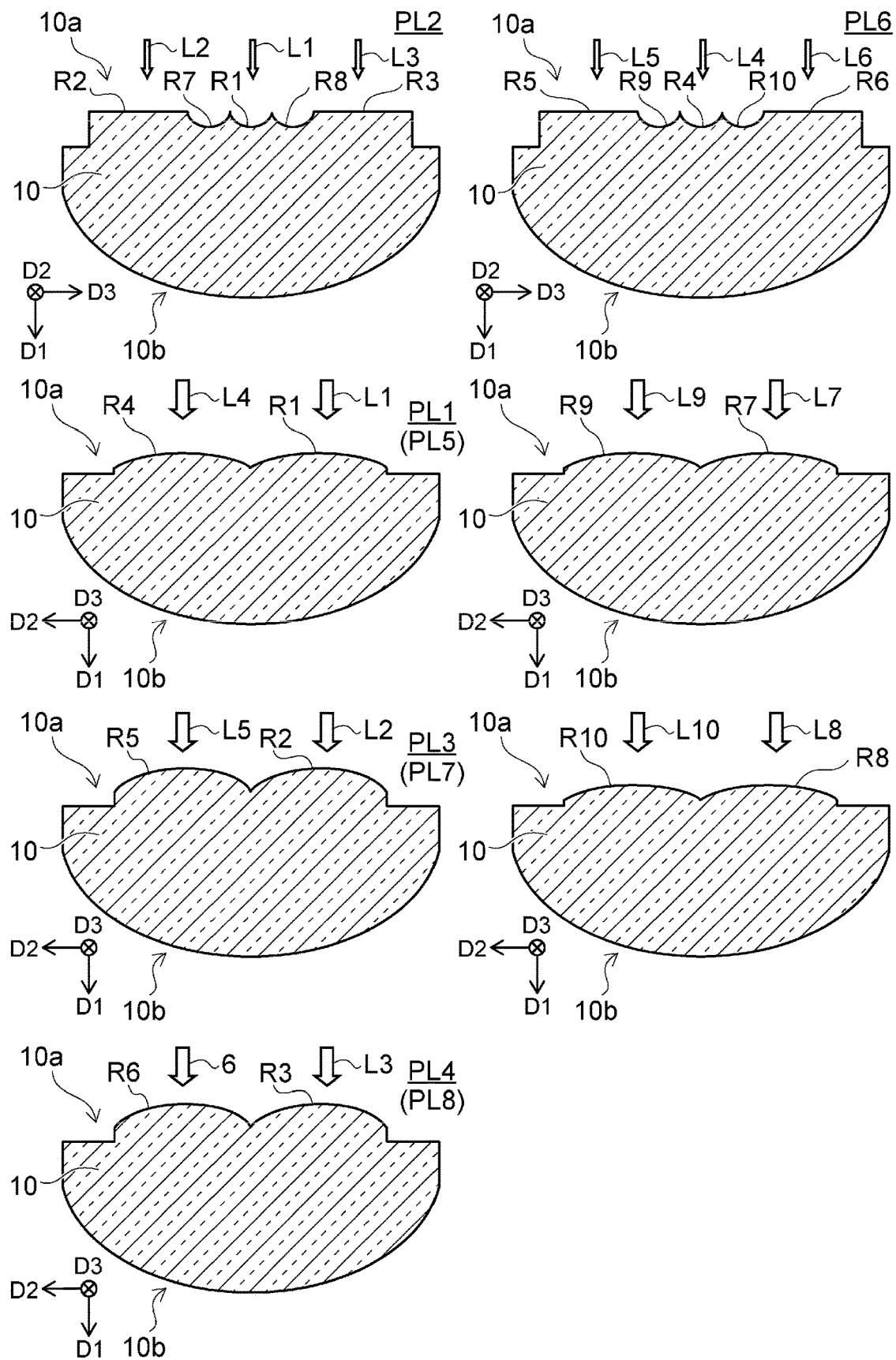
FIG. 2 is a schematic diagram showing an example of the light source module according to the first embodiment.

FIG. 1 and FIG. 2 are schematic diagrams showing an example of a light source module according to a first embodiment.

FIG. 1 is a schematic perspective view. FIG. 2 shows schematic sectional views taken along a plurality of cutting planes illustrated in FIG. 1.

As shown in FIG. 1, a light source module 110 according to certain embodiments includes a light source part 30, a first optical element 10, and a second optical element 20.

The light source part 30 is configured to emit at least a first light beam L1. In this example, the light source part 30 is configured to emit first to sixth light beams L1 to L6. The first to sixth light beams L1 to L6 are examples of light beams emitted from the light source part 30.

The first optical element 10 has a first surface 10a and a second surface 10b. The light beams described above (such as the first to sixth light beams L1 to L6) are incident on the first surface 10a. These light beams (such as the first to sixth light beams L1 to L6) are emitted from the second surface 10b.

The second optical element 20 has a first end 20a and a second end 20b. The light beams LL (such as the first to sixth light beams L1 to L6), which are light beams emitted from the first optical element 10 are incident on the first end 20a. The light beams LL (such as the first to sixth light beams L1 to L6) that have been incident on the first end 20a are emitted from the second end 20b. The second optical element 20 is, for example, a rod lens.

The light beams described above (such as the first to sixth light beams L1 to L6) are incident on the first surface 10a of the first optical element 10 along a first direction D1. In the description below, the first light beam L1 will be described, and then the second to sixth light beams L2 to L6 will be described.

The first light beam L1 has a first width w1 on the first surface 10a and a second width w2 on the first surface 10a. The first width w1 is a width of the first light beam L1 along a second direction D2. The second direction D2 intersects the first direction D1. The second width w2 is a width of the first light beam L1 along a third direction D3. The third direction D3 intersects the plane including the first direction D1 and the second direction D2. The first width w1 is greater than the second width w2. For example, the first width w1 is the maximum width of the first light beam L1 on the first surface 10a. For example, the second width w2 is the minimum width of the first light beam L1 on the first surface 10a.

As described above, the first light beam L1 has an anisotropic cross-sectional shape is anisotropic. The first light beam L1 is, for example, a laser beam. For example, the first light beam L1 is incident on the first surface 10a in a far field pattern. The second direction D2 is, for example, the major axis direction of the far field pattern. The third direction D3 is, for example, the minor axis direction of the far field pattern.

In an example, the angle defined by the second direction D2 and the first direction D1 is in the range of, for example, 85 degrees to 95 degrees. In an example, the angle defined by the third direction D3 and the plane including the first direction D1 and the second direction D2 is in the range of, for example, 85 degrees to 95 degrees. The angle defined by the second direction D2 and the third direction D3 is in the range of, for example, 85 degrees to 95 degrees.

The first surface 10a of the first optical element 10 includes a first region R1. At least a portion of the first light beam L1 is incident on the first region R1.

As shown in FIG. 1 and FIG. 2, the first region R1 has a protruding shape in a first cutting plane PL1 including the first direction D1 and the second direction D2. As shown in FIG. 1 and FIG. 2, the first region R1 has a recessed shape in a second cutting plane PL2 including the first direction D1 and the third direction D3. The first region R1 may have shape anisotropy.

On the other hand, as shown in FIG. 2, the second surface 10b has a protruding shape in the first cutting plane PL1 and in the second cutting plane PL2. In an example, the second surface 10b is symmetrical about the axis (the first direction D1). The second surface 10b is, for example, an axially-symmetric aspheric surface.

In certain embodiments, the first light beam L1 described above is incident on the first region R1 having shape anisotropy as described above.

For example, the first region R1 reduces divergence of the first light beam L1 in the second direction D2. For example, the first region R1 substantially collimates the first light beam L1 in the second direction D2. The first light beam L1 is then condensed at the second surface 10b of the first optical element 10 in the second direction D2. For example, the first region R1 functions as a collimating lens in the second direction D2. The second surface 10b functions as a condensing lens. The first light beam L1 that has been emitted from the second surface 10b of the first optical element 10 enters the first end 20a of the second optical element 20. This structure enables the reduction in the size of the first end 20a (aperture of the second optical element 20). For example, even in the case where the second optical element 20 (such as a rod lens) is short, high uniformity of the second-direction D2 component of light emitted from the second end 20b of the second optical element 20 can be obtained.

On the other hand, the first light beam L1 incident on the first region R1 is not collimated in, for example, the third direction D3. The first light beam L1, having a divergence angle properly controlled in the third direction D3, can be incident on the first end 20a of the second optical element 20. For example, the first light beam L1 propagates through the second optical element 20 and is emitted from the second end 20b with reduction in excessive reflection. Thus, losses caused by reflection can be reduced. For example, the size of the first end 20a (i.e., aperture of the second optical element 20) can be reduced. For example, when the second optical element 20 (such as a rod lens) is short, high uniformity of the third-direction D3 component of light emitted from the second end 20b of the second optical element 20 can be obtained.

As has already been described, at least one second light beam L2 and at least one third light beam L3 may be further emitted in certain embodiments. The second light beam L2 and the third light beam L3 are incident on the first surface 10a along the first direction D1.

The second light beam L2 has a third width w3 along the second direction D2 on the first surface 10a and a fourth width w4 along the third direction D3 on the first surface 10a. The third width w3 is greater than the fourth width w4.

The third light beam L3 has a fifth width w5 along the second direction D2 on the first surface 10a and a sixth width w6 along the third direction D3 on the first surface 10a. The fifth width w5 is greater than the sixth width w6.

The second light beam L2 and the third light beam L3 are, for example, laser beams. The second light beam L2 and the third light beam L3 are incident on the first surface 10a of the first optical element 10 in far field patterns.

The first surface 10a of the first optical element 10 includes a second region R2 and a third region R3. At least a portion of the second light beam L2 is incident on the second region R2. At least a portion of the third light beam L3 is incident on the third region R3. The direction from the second region R2 to the first region R1 is along the third direction D3. The first region R1 is disposed between the second region R2 and the third region R3 in the third direction D3.

For example, the second region R2 and the third region R3 are disposed at the ends of the first surface 10a in the third direction D3. For example, the first region R1 is disposed at a center region of the first surface 10a in the third direction D3.

As shown in FIG. 1 and FIG. 2, the second region R2 has a protruding shape in a third cutting plane PL3 including the first direction D1 and the second direction D2. As shown in FIG. 1 and FIG. 2, the radius of curvature of the second region R2 in the third cutting plane PL3 is smaller than the radius of curvature of the second region R2 in the second cutting plane PL2. For example, in the second cutting plane PL2, at least a portion of a the second region R2 may be a straight line. In this case, the curvature of the second region R2 in the second cutting plane PL2 is substantially zero, and the second region R2 in the second cutting plane PL2 has a greatly large (such as infinite) radius of curvature.

As shown in FIG. 1 and FIG. 2, the third region R3 has a protruding shape in a fourth cutting plane PL4 including the first direction D1 and the second direction D2. As shown in FIG. 1 and FIG. 2, the radius of curvature of the third region R3 in the fourth cutting plane PL4 is smaller than the radius of curvature of the third region R3 in the second cutting plane PL2. For example, in the second cutting plane PL2, at least a portion of the third region R3 may be a straight line. In this case, the curvature of the third region R3 in the second cutting plane PL2 is substantially zero, and the third region R3 in the second cutting plane PL2 has a greatly large (such as infinite) radius of curvature.

As described above, in certain embodiments, the regions of the first surface 10a on each of which a corresponding one of a plurality of light beams is to be incident may have shapes different from each other. For example, shapes of the regions of the first surface 10a may be different such that the divergence angle in the third direction D3 of the second light beam L2 incident on the second region R2 and emitted from the second surface 10b can be close to the divergence angle in the third direction D3 of the first light beam L1 incident on the first region R1 and emitted from the second surface 10b. For example, shapes of the regions of the first surface 10a may be different such that the divergence angle in the third direction D3 of the third light beam L3 incident on the third region R3 and emitted from the second surface 10b can be close to the divergence angle in the third direction D3 of the first light beam L1 incident on the first region R1 and emitted from the second surface 10b. Such light beams are incident on the first end 20a of the second optical element 20. This structure allows for reducing the difference in the numbers of reflection between a plurality of light beams (such as the first to third light beams L1 to L3) while the plurality of light beams propagate through the second optical element 20. A plurality of light components contained in the first light beam L1 may be reflected different numbers of times while propagating through the second optical element 20. A plurality of light components contained in the second light beam L2 may be reflected different numbers of times while propagating through the second optical element 20. The difference between the difference in the numbers of reflection among the first light beams L1 and the difference in the numbers of reflection among the second light beams L2 can be reduced. The numbers of reflection can be substantially the same. Reduction in difference of reflection allows for reducing excessive reflection, so that losses caused by reflection can be reduced.

For example, in a first reference example, the curvature of the first surface 10a of the first optical element 10 is uniform in the third direction D3. For example, each of the first to third regions R1 to R3 is a straight line in the second cutting plane PL2 in the first reference example. In this case, the divergence angle in the third direction D3 of a light beam incident on the central portion (the first region R1 being a straight line in a cross-sectional view) of the first optical element 10 and emerging from the second surface 10b is, for example, 3.6 degrees. On the other hand, the divergence angle in the third direction D3 of a light beam incident on an end portion (such as the second region R2 and the third region R3 having straight sectional shapes) of the first optical element 10 and emerging from the second surface 10b is, for example, 11.6 degrees. Accordingly, the divergence angle of a light beam emitted from the first optical element 10 varies according to the position of the light beam incident on the first optical element 10 in the first reference example.

On the other hand, in certain embodiments, a light beam incident on the central portion (i.e., the first region R1 having a concave sectional shape) of the first optical element 10 and emitted from the second surface 10b is, has a divergence angle of, for example, 12.7 degrees, in the third direction D3. On the other hand, a light beam incident on an end portion (such as the second region R2 and the third region R3 having straight sectional shapes) of the first optical element 10 and emitted from the second surface 10b has a divergence angle of, for example, 11.6 degrees, in the third direction D3. Thus, in certain embodiments, the difference in the divergence angles in the third direction D3 between light beams emitted from the first optical element 10 can be reduced even if the positions at which the light beams are incident on the first optical element 10 differ from each other.

On the other hand, the second light beam L2 and the third light beam L3 incident on the second region R2 and the third region R3, respectively, are collimated in, for example, the second direction D2. Accordingly, the size of the first end 20a can be reduced. For example, even in the case where a length of the second optical element 20 (such as a rod lens) is reduced, high uniformity of the second-direction D2 component of light emitted from the second end 20b of the second optical element 20 can be obtained.

As shown in FIG. 1, the length of the second optical element 20 along the direction from the first end 20a to the second end 20b is referred to as a length w21. The length w21 is a length along the axis direction of the second optical element 20. The length w21 is longer than a length of the second optical element 20 along a direction intersecting the direction from the first end 20a to the second end 20b. The length w21 is, for example, a length of the second optical element 20 along the first direction D1. The length of the second optical element 20 along a direction intersecting the above direction from the first end 20a to the second end 20b is, for example, a length w22 or a length w23. The length w22 is, for example, a length of the second optical element 20 along the second direction D2. The length w23 is, for example, a length of the second optical element 20 along the third direction D3.

In an example, the length w21 is in the range of, for example, 8 mm to 100 mm. The length w21 may be in the range of, for example, 25 mm to 35 mm (approximately 30 mm). In an example, the length w22 is in the range of, for example, 0.5 mm to 4 mm. The length w22 may be in the range of, for example, 1 mm to 2 mm (approximately 1.28 mm). In an example, the length w23 may be in the range of, for example, 0.5 mm to 5 mm. The length w23 may be in the range of, for example, 1.5 mm to 3 mm (approximately 2.2 mm).

As shown in FIG. 1 and FIG. 2, an additional region (such as a seventh region R7) may be disposed between the first region R1 and the second region R2. A further additional region (such as an eighth region R8) may be disposed between the first region R1 and the third region R3. As shown in FIG. 1, the additional region (such as the seventh region R7) has a protruding shape in a cutting plane including the first direction D1 and the second direction D2. As shown in FIG. 2, the seventh region R7 has a recessed shape in the second cutting plane PL2. As shown in FIG. 1, the eighth region R8 has a protruding shape in a cutting plane including the first direction D1 and the second direction D2. As shown in FIG. 2, the eighth region R8 has a recessed shape in the second cutting plane PL2. A seventh light beam L7 is incident on the seventh region R7 (see FIG. 2). An eighth light beam L8 is incident on the eighth region R8 (see FIG. 2).

Figure 6:
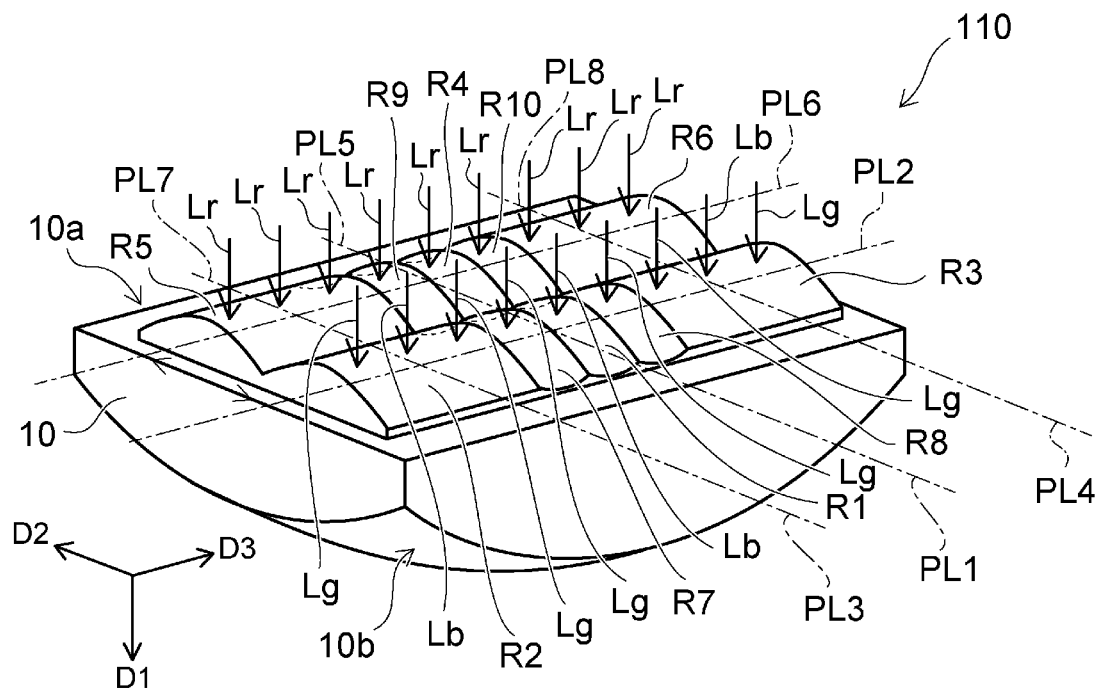
FIG. 6 is a schematic perspective view showing an example of a part of the light source module according to the first embodiment.

As described above, the light source part 30 is configured to further emit an additional light beam different from the first light beam L1. For example, the additional light beam differs from the first light beam L1. For example, the additional light beam is the seventh light beam L7. The seventh light beam L7 is a second-color light beam Lg, which is illustrated in FIG. 6 described below, incident on the seventh region R7. The peak wavelength of the additional light beam may be the same as the peak wavelength of the first light beam L1. The additional light beam is incident on the first surface 10a along the first direction D1. The additional light beam has a width along the second direction D2 on the first surface 10a and a width along the third direction D3 on the first surface 10a. The width along the second direction D2 is greater than the width along the third direction D3. The first surface 10a includes an additional region (such as the seventh region R7) on which at least a portion of the additional light beam is incident. The direction from the additional region (the seventh region R7) to the first region R1 lies along the third direction D3. The additional region (the seventh region R7) has a protruding shape in another cutting plane including the first direction D1 and the second direction D2. The other region (the seventh region R7) has a recessed shape in the second cutting plane PL2.

The second region R2, the seventh region R7, the first region R1, the eighth region R8, and the third region R3 are aligned along the third direction D3.

As has already been described, the light source part 30 may be further configured to emit the fourth to sixth light beams L4 to L6. The fourth to sixth light beams L4 to L6 are incident on the first surface 10a of the first optical element 10 along the first direction D1.

The fourth light beam L4 has a seventh width w7 along the second direction D2 on the first surface 10a and an eighth width w8 along the third direction D3 on the first surface 10a. The seventh width w7 is greater than the eighth width w8.

The fifth light beam L5 has a ninth width w9 along the second direction D2 on the first surface 10a and a tenth width w10 along the third direction D3 on the first surface 10a. The ninth width w9 is greater than the tenth width w10.

The sixth light beam L6 has an eleventh width w11 along the second direction D2 on the first surface 10a and a twelfth width w12 along the third direction D3 on the first surface 10a. The eleventh width w11 is greater than the twelfth width w12.

The fourth to sixth light beams L4 to L6 are, for example, laser beams. The fourth to sixth light beams L4 to L6 are incident on the first surface 10a of the first optical element 10 in far field patterns.

The first surface 10a includes fourth to sixth regions R4 to R6. At least a portion of the fourth light beam L4 is incident on the fourth region R4. At least a portion of the fifth light beam L5 is incident on the fifth region R5. At least a portion of the sixth light beam L6 is incident on the sixth region R6.

The direction from the fourth region R4 to the first region R1 intersects the plane including the first direction D1 and the third direction D3. In an example, the direction from the fourth region R4 to the first region R1 is along the second direction D2. For example, the absolute value of the angle defined by the direction from the fourth region R4 to the first region R1 and the second direction D2 may be 10 degrees or less. The absolute value of the angle may be 30 degrees or less. The direction from the fourth region R4 to the first region R1 may be inclined with respect to the second direction D2.

For example, the direction from the fifth region R5 to the fourth region R4 is along the third direction. For example, the fourth region R4 is disposed between the fifth region R5 and the sixth region R6 in the third direction D3.

As shown in FIG. 2, the fourth region R4 has a protruding shape in a fifth cutting plane PL5 including the first direction D1 and the second direction D2. As shown in FIG. 2, the fourth region R4 has a recessed shape in a sixth cutting plane PL6 including the first direction D1 and the third direction D3.

As shown in FIG. 2, the fifth region R5 has a protruding shape in a seventh cutting plane PL7 including the first direction D1 and the second direction D2. The radius of curvature of the fifth region R5 in the seventh cutting plane PL7 is smaller than the radius of curvature of the fifth region R5 in the sixth cutting plane PL6. In this example, in the sixth cutting plane PL6, at least a portion of the fifth region R5 is, for example, a straight line.

As shown in FIG. 2, the sixth region R6 has a protruding shape in an eighth cutting plane PL8 including the first direction D1 and the second direction D2. The radius of curvature of the sixth region R6 in the eighth cutting plane PL8 is smaller than the radius of curvature of the sixth region R6 in the sixth cutting plane PL6. In this example, in the sixth cutting plane PL6, at least a portion of the sixth region R6 is, for example, a straight line.

As described above, in this example, the fourth to sixth regions R4 to R6 are disposed on the first surface 10a. The direction from an array of the fourth to sixth regions R4 to R6 to an array of the first to third regions R1 to R3 lies along the second direction D2. For example, a straight line passing through the midpoint between the array of the fourth to sixth regions R4 to R6 and the array of the first to third regions R1 to R3 and lying along the first direction D1 substantially coincides with the optical axis of the second surface 10b.

For example, in the fourth to sixth regions R4 to R6, the divergence angle in the third direction D3 of the fifth light beam L5 incident on the fifth region R5 and emitted from the second surface 10b can be close to the divergence angle in the third direction D3 of the fourth light beam L4 incident on the fourth region R4 and emitted from the second surface 10b. For example, in the second direction D2, the divergence angle in the third direction D3 of the sixth light beam L6 incident on the sixth region R6 and emitted from the second surface 10b can be close to the divergence angle in the third direction D3 of the fourth light beam L4 incident on the fourth region R4 and emitted from the second surface 10b. Such light beams are incident on the first end 20a of the second optical element 20. This structure allows for reducing the difference in the numbers of reflection between a plurality of light beams (such as the fourth to sixth light beams L4 to L6) while propagating through the second optical element 20. The numbers of reflection while propagating through the second optical element 20 can be substantially the same. Reduction in difference of reflection allows for reducing excessive reflection, so that losses caused by reflection are reduced.

On the other hand, light beams (such as the fourth to sixth light beams L4 to L6) incident on the fourth to sixth regions R4 to R6, respectively, are collimated in, for example, the second direction D2. Accordingly, the size of the first end 20a can be reduced. For example, even in the case where the second optical element 20 (such as a rod lens) is short, the second-direction D2 component of light emitted from the second end 20b of the second optical element 20 can be greatly uniform.

As shown in FIG. 1 and FIG. 2, an additional region (such as a ninth region R9) may be disposed between the fourth region R4 and the fifth region R5. Further additional region (such as a tenth region R10) may be disposed between the fourth region R4 and the sixth region R6. As shown in FIG. 1, the ninth region R9 has a protruding shape in a cutting plane including the first direction D1 and the second direction D2. As shown in FIG. 2, the ninth region R9 has a recessed shape in the sixth cutting plane PL6. As shown in FIG. 1, the tenth region R10 has a protruding shape in a cutting plane including the first direction D1 and the second direction D2. As shown in FIG. 2, the tenth region R10 has a recessed shape in the sixth cutting plane PL6. A ninth light beam L9 is incident on the ninth region R9 (see FIG. 2). A tenth light beam L10 is incident on the tenth region R10 (see FIG. 2).

The fifth region R5, the ninth region R9, the fourth region R4, the tenth region R10, and the sixth region R6 are aligned along the third direction D3.

For example, the "second direction D2" refers to a direction in which one of the plurality of light beams (the first to tenth light beams L1 to L10) has the maximum width. The "third direction D3" refers to a direction in which each of the plurality of light beams has the minimum width.

Examples of the light source module 110 according to certain embodiments and a projector employing the light source module 110 will be described below.

Figure 3:
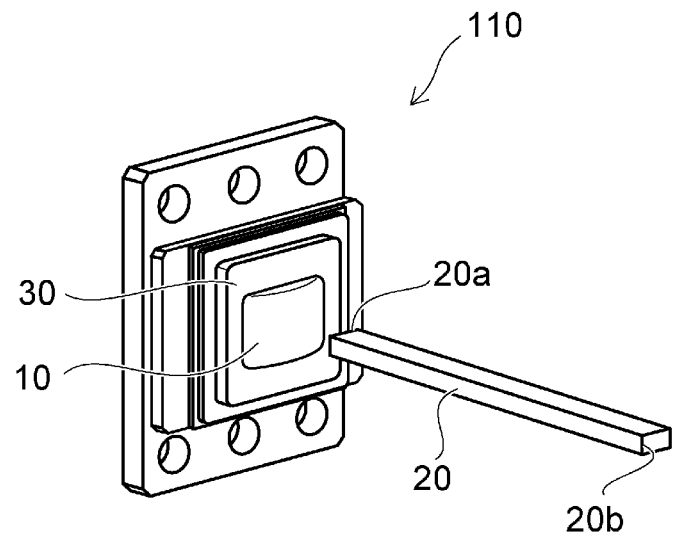
FIG. 3 is a schematic perspective view showing an example of the light source module according to certain embodiments.
Figure 4:
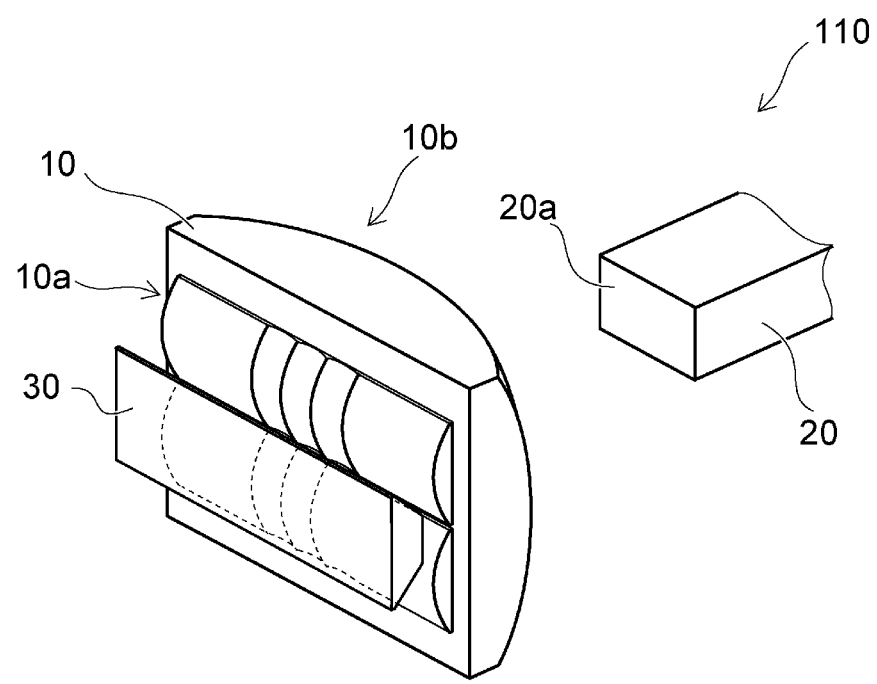
FIG. 4 is a schematic perspective view showing an example of the light source module according to certain embodiments.

FIG. 3 and FIG. 4 are schematic perspective views for illustrating the light source module according to certain embodiments.

Figure 5:
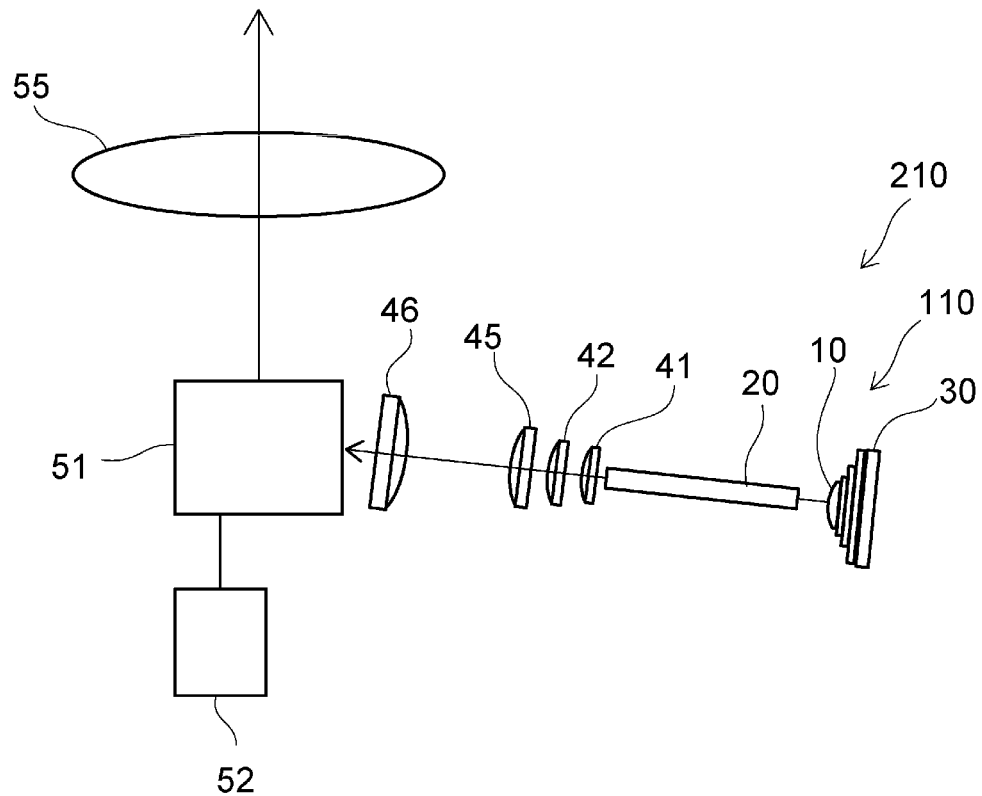
FIG. 5 is a schematic diagram showing an example of a projector employing the light source module according to certain embodiments.

FIG. 5 is a schematic diagram illustrating the projector employing the light source module according to certain embodiments.

As shown in FIG. 3 and FIG. 5, the light source part 30 and the first optical element 10 are combined together in the light source module 110. Light beams that have emitted from the first optical element 10 are incident on the first end 20a of the second optical element 20.

As shown in FIG. 5, the light beams that have been emitted from the second optical element 20 enter, for example, a light modulator 51. The light modulator 51 modulates the intensity of the light entering the light modulator 51 and emits the resulting light. The light modulator 51 includes, for example, a digital micromirror device (DMD). A data processor 52 (such as a computer) sends an image signal to the light modulator 51. The light modulator 51 is configured to perform modulation according to the image signal. The light modulated by the light modulator 51 passes through a projection lens 55 and travels toward, for example, a projection screen. A desired image is formed on the projection screen.

In this example, optical elements (such as optical elements 41, 42, 45, and 46) are disposed in the optical path between the second optical element 20 and the light modulator 51. These optical elements are, for example, lenses.

The light source module 110 may include the optical elements (such as the optical elements 41, 42, 45, and 46).

Examples of the colors of a plurality of light beams will be described below.

FIG. 6 is a schematic perspective view showing a portion of an example of the light source module according to the first embodiment.

As shown in FIG. 6, in this example, first-color light beams Lb, second-color light beams Lg, and third-color light beams Lr are incident on the first surface 10a of the first optical element 10. The first-color light beams Lb, second-color light beams Lg, and third-color light beams Lr are emitted from the light source part 30.

In this example, a first-color light beam Lb is incident on the first region R1. Corresponding two of the second-color light beams Lg and a corresponding one of the first-color light beams Lb are incident on the second region R2. On the second region R2, the corresponding one of the first-color light beams Lb is located between the corresponding two of the second-color light beams Lg in the third direction. In this example, a corresponding one of the second-color light beams Lg is incident on each of the seventh region R7 and the eighth region R8. Corresponding two of the second-color light beams Lg and a corresponding one of the first-color light beams Lb are incident on the third region R3. On the third region R3, the corresponding one of the first-color light beams Lb is located between the corresponding two of the second-color light beams Lg in the third direction.

As shown in FIG. 6, in this example, corresponding one or more of the third-color light beams Lr are incident on each of the fourth to sixth regions R4 to R6, the ninth region R9, and the tenth region R10.

A first peak wavelength of each of the first-color light beams Lb differs from a second peak wavelength of each of the second-color light beams Lg. A third peak wavelength of the third-color light beams Lr differs from the first peak wavelength and differs from the second peak wavelength. In an example, the second peak wavelength is between the first peak wavelength and the third peak wavelength.

In an example, the second peak wavelength is longer than the first peak wavelength, and the third peak wavelength is longer than the second peak wavelength. For example, the first-color light beams Lb are blue light beams, the second-color light beams Lg are green light beams, and the third-color light beams Lr are red light beams.

The first peak wavelength is, for example, 440 nm or more and less than 490 nm. The second peak wavelength is, for example, 500 nm or more and less than 550 nm. The third peak wavelength is, for example, in a range of 600 nm to 650 nm.

The first to third regions R1 to R3 in the example described above will be described below in more detail. In this example, the first light beam L1 incident on the first region R1 is a first-color light beam Lb. In this example, one of a plurality of second light beams L2 incident on the second region R2 is a second-color light beam Lg. One of a plurality of third light beams L3 incident on the third region R3 is a second-color light beam Lg.

In this case, the peak wavelength of the one of the second light beams L2 (the second-color light beam Lg) differs from the peak wavelength of the first light beam L1 (the first-color light beam Lb). The peak wavelength of the one of the third light beams L3 (the second-color light beam Lg) differs from the peak wavelength of the first light beam L1 (the first-color light beam Lb). The difference in the peak wavelengths between the one of the third light beams L3 (the second-color light beam Lg) and the one of the second light beams L2 is smaller than the difference in the peak wavelengths between the one of the second light beams L2 and the first light beam L1. For example, the peak wavelength of one of the third light beam L3 (such as the second-color light beam Lg) is substantially the same as the peak wavelength of a corresponding one of the second light beam L2 (such as the second-color light beam Lg).

In this example, the fourth light beam L4 incident on the fourth region R4 is a third-color light beam Lr. The peak wavelength of the fourth light beam L4 incident on the fourth region R4 may differ from the peak wavelength of the first light beam L1 incident on the first region R1. In this example, the fourth to sixth light beams L4 to L6 incident on the fourth to sixth regions R4 to R6, respectively, are third-color light beams Lr. For example, the peak wavelength of each of the fifth light beams L5 incident on the fifth region R5 may differ from the peak wavelength of each of the second light beams L2 incident on the second region R2. For example, the peak wavelength of each of the sixth light beams L6 incident on the sixth region R6 may differ from the peak wavelength of each of the third light beams L3 incident on the third region R3.

For example, the peak wavelength of the fourth light beam L4, the peak wavelength of each of the fifth light beams L5, and the peak wavelength of each of the sixth light beams L6 may be substantially the same.

Figure 7:
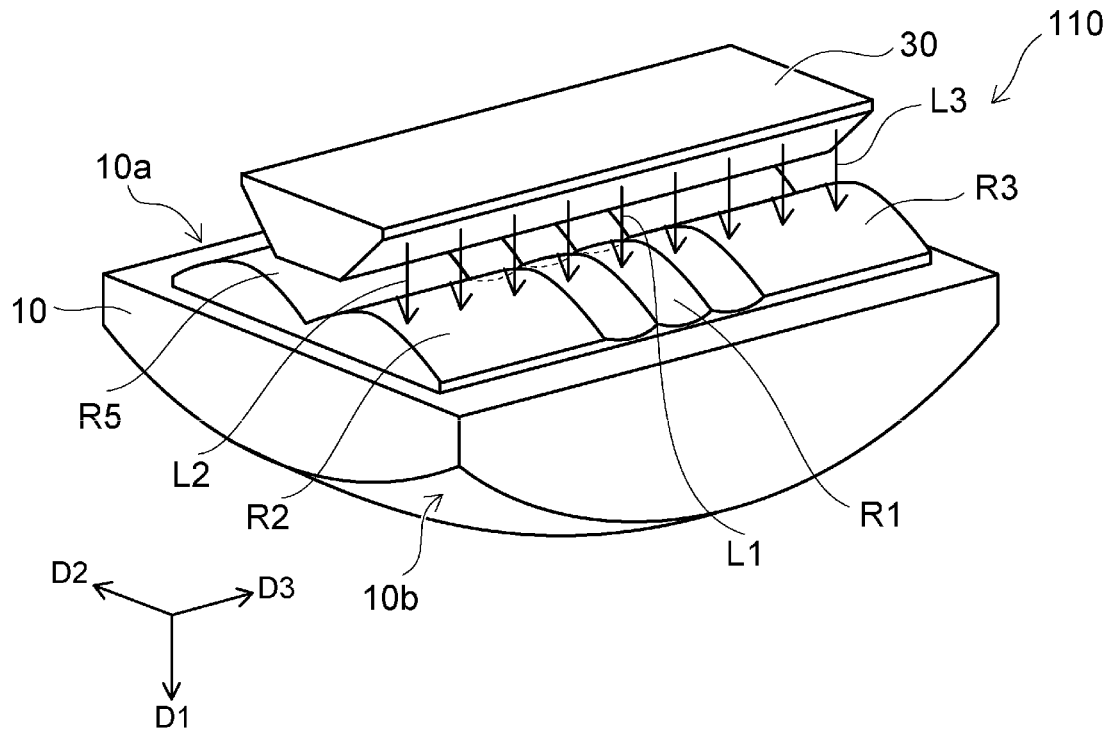
FIG. 7 is a schematic perspective view showing an example of a part of the light source module according to the first embodiment.

FIG. 7 is a schematic perspective view for illustrating a part of the light source module according to the first embodiment.

The first optical element 10 may be disposed near the light source part 30 as shown in FIG. 7. For example, a distance between the light source part 30 and the first optical element 10 (for example, the shortest distance between the light source part 30 and the first optical element 10) may be shorter than a length of the first optical element 10 along the third direction D3. For example, the distance between the light source part 30 and the first optical element 10 described above may be shorter than a length of the first optical element 10 along the second direction D2. For example, the distance between the light source part 30 and the first optical element 10 described above may be shorter than a length of the first optical element 10 along the first direction D1. This allows, for example, reduction in the size of the light source module 110.

Figure 8:
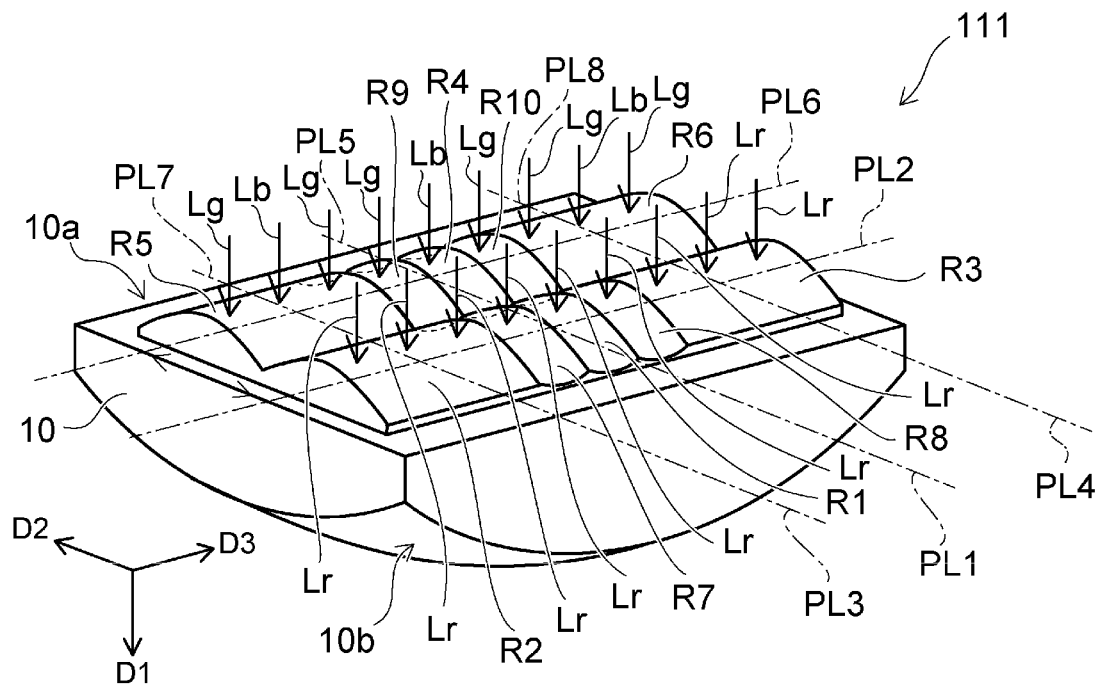
FIG. 8 is a schematic perspective view showing an example of a part of the light source module according to the first embodiment.

FIG. 8 is a schematic perspective view for illustrating a part of the light source module according to the first embodiment.

As shown in FIG. 8, also in a light source module 111 according to certain embodiments, first-color light beams Lb, second-color light beams Lg, and third-color light beams Lr are incident on the first surface 10a of the first optical element 10. The first-color light beams Lb, the second-color light beams Lg, and the third-color light beams Lr are emitted from the light source part 30. Illustrations of the light source part 30 and the second optical element 20 are omitted in FIG. 8.

In the light source module 111, one or more third-color light beams Lr are incident on each of the first to third regions R1 to R3, the seventh region R7, and the eighth region R8.

One of the first-color light beams Lb is incident on the fourth region R4. Two of the second-color light beams Lg and one of the first-color light beams Lb are incident on the fifth region R5. On the fifth region R5, the one of the first-color light beams Lb is located between the two of the second-color light beams Lg in the third direction. In this example, a corresponding one of the second-color light beams Lg is incident on each of the ninth region R9 and the tenth region R10. Two of the second-color light beams Lg and one of the first-color light beams Lb are incident on the sixth region R6. On the sixth region R6, the one of the first-color light beams Lb is located between the two of the second-color light beams Lg in the third direction.

In this example, each of the peak wavelength of the one of the second light beams L2 (the third-color light beam Lr) and the peak wavelength of the one of the third light beams L3 (the third-color light beam Lr) is substantially the same as the peak wavelength of the first light beam L1 (the third-color light beam Lr).

Second Embodiment

Figure 9:
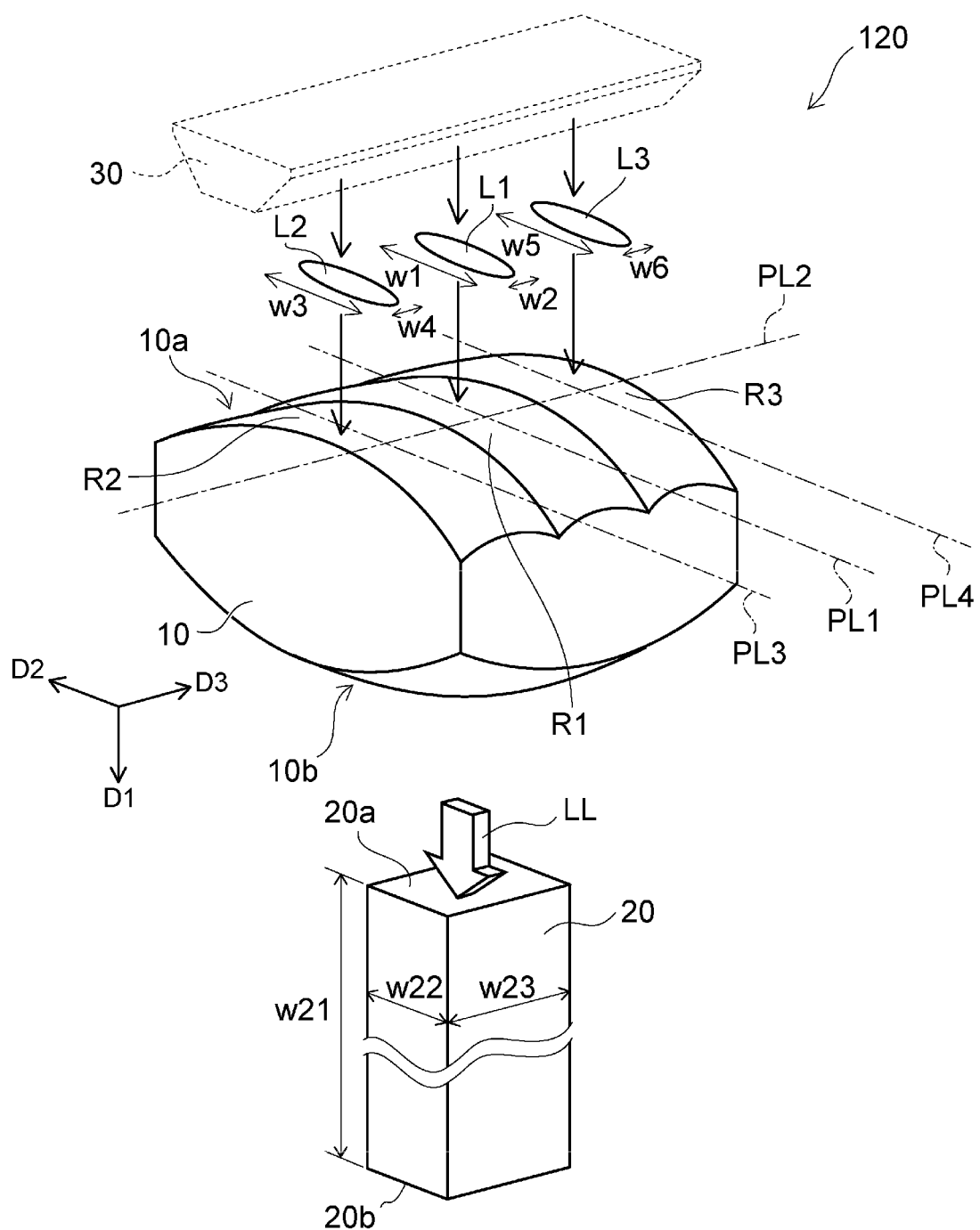
FIG. 9 is a schematic diagram showing an example of a light source module according to a second embodiment.
Figure 10:
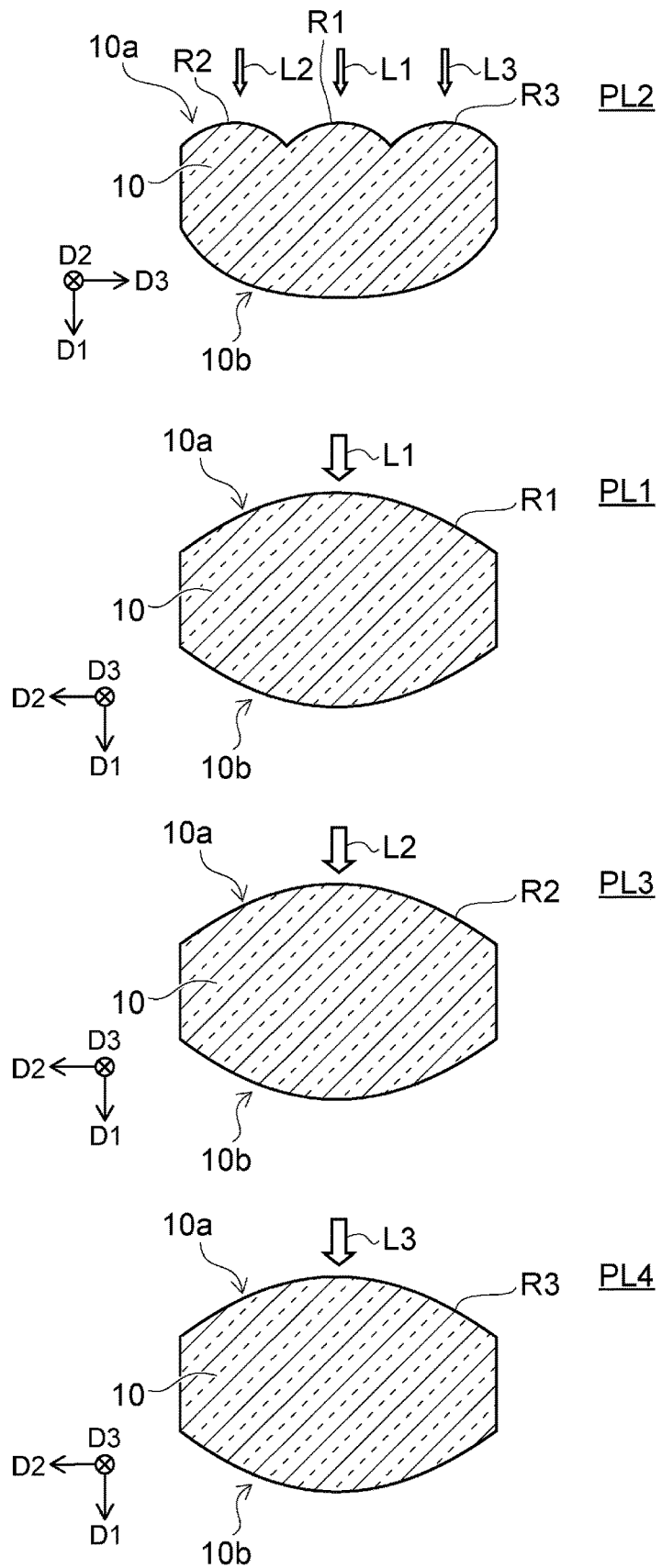
FIG. 10 is a schematic diagram showing an example of the light source module according to the second embodiment.

FIG. 9 and FIG. 10 are schematic diagrams illustrating a light source module according to a second embodiment.

FIG. 9 is a schematic perspective view. FIG. 10 shows schematic cross-sectional views each corresponding to a respective one of a plurality of cutting planes illustrated in FIG. 9.

As shown in FIG. 9, a light source module 120 according to the second embodiment includes a light source part 30, a first optical element 10, and a second optical element 20.

The light source part 30 is configured to emit, for example, first to third light beams L1 to L3. The first to third light beams L1 to L3 are examples of light beams emitted from the light source part 30.

The first optical element 10 has a first surface 10a and a second surface 10b. The light beams described above (such as the first to third light beams L1 to L3) are incident on the first surface 10a. These light beams (such as the first to third light beams L1 to L3) are emitted from the second surface 10b.

The second optical element 20 has the first end 20a and the second end 20b. Light beams LL, which are light beams that have been emitted from the first optical element 10 (such as the first to third light beams L1 to L3), are incident on the first end 20a. The light beams LL (such as the first to third light beams L1 to L3) that have been incident on the first end 20a is emitted from the second end 20b. The second optical element 20 is, for example, a rod lens.

The light beams (such as the first to third light beams L1 to L3) are incident on the first surface 10a along a first direction D1. In the description below, the first light beam L1 will be illustrated, and then the second light beam L2 and the third light beam L3 will be illustrated.

The first light beam L1 has a first width w1 along the second direction D2 intersecting the first direction D1 on the first surface 10a. The first light beam L1 has a second width w2 along the third direction D3 intersecting the plane including the first direction D1 and the second direction D2 on the first surface 10a. The first width w1 is greater than the second width w2. The first light beam L1 is, for example, a laser beam. For example, the first light beam L1 is incident on the first surface 10a with a far field pattern. The second direction D2 is, for example, the major axis direction of the far field pattern. The third direction D3 is, for example, the minor axis direction of the far field pattern.

The first surface 10a includes a first region R1 on which at least a portion of the first light beam L1 is incident. At least a portion of the first region R1 has a protruding shape in a first cutting plane PL1 including the first direction D1 and the second direction D2 and in a second cutting plane PL2 including the first direction D1 and the third direction D3. On the other hand, the second surface 10b has a protruding shape in the first cutting plane PL1 and the second cutting plane PL2.

As shown in FIG. 10, in certain embodiments, the radius of curvature of the at least a portion of the first region R1 in the first cutting plane PL1 is larger than the radius of curvature of the at least a portion of the first region R1 in the second cutting plane PL2.

For example, the first region R1 can reduce the divergence of the first light beam L1 in the second direction D2. For example, the first region R1 substantially collimates the first light beam L1 in the second direction D2. The first light beam L1 is then condensed with the second surface 10b of the first optical element 10 in the second direction D2. The first light beam L1 that has been emitted from the second surface 10b of the first optical element 10 is incident on the first end 20a of the second optical element 20. This structure allows reduction in the size of the first end 20a (i.e., aperture of the second optical element 20). For example, even in the case where the second optical element 20 (such as a rod lens) is short, light emitted from the second end 20b of the second optical element 20 can be greatly uniform in the second direction D2.

On the other hand, the first light beam L1 incident on the first region R1 is not collimated in, for example, the third direction D3. The first light beam L1, having a divergence angle appropriately controlled in the third direction D3, can be incident on the first end 20a of the second optical element 20. Accordingly, the first light beam L1 propagates through the second optical element 20 and is emitted from the second end 20b with excessive reflection being reduced. Losses caused by reflection can be reduced. For example, the size of the first end 20a (aperture of the second optical element 20) can be reduced. For example, even in the case where the second optical element 20 (such as a rod lens) is short, the light emitted from the second end 20b of the second optical element 20 can be greatly uniform in the third direction D3.

As has already been described, in certain embodiments, the second light beam L2 and the third light beam L3 may be emitted. The second light beam L2 and the third light beam L3 are incident on the first surface 10a along the first direction D1.

The second light beam L2 has a third width w3 along the second direction D2 on the first surface 10a and a fourth width w4 along the third direction D3 on the first surface 10a. The third width w3 is greater than the fourth width w4.

The third light beam L3 has a fifth width w5 along the second direction D2 on the first surface 10a and a sixth width w6 along the third direction D3 on the first surface 10a. The fifth width w5 is greater than the sixth width w6.

The second light beam L2 and the third light beam L3 are, for example, laser beams. The second light beam L2 and the third light beam L3 are incident on the first surface 10a of the first optical element 10 in far field patterns.

The first surface 10a of the first optical element 10 includes a second region R2 and a third region R3. At least a portion of the second light beam L2 is incident on the second region R2. At least a portion of the third light beam L3 is incident on the third region R3. The direction from the second region R2 to the first region R1 lies along the third direction D3. The first region R1 is located between the second region R2 and the third region R3 in the third direction D3.

As shown in FIG. 9 and FIG. 10, at least a portion of the second region R2 has a protruding shape in a third cutting plane PL3 including the first direction D1 and the second direction D2 and in the second cutting plane PL2. The radius of curvature of the at least a portion of the second region R2 in the third cutting plane PL3 is larger than the radius of curvature of the at least a portion of the second region R2 in the second cutting plane PL2.

As shown in FIG. 9 and FIG. 10, at least a portion of the third region R3 has a protruding shape in a fourth cutting plane PL4 including the first direction D1 and the second direction D2 and in the second cutting plane PL2. The radius of curvature of the at least a portion of the third region R3 in the fourth cutting plane PL4 is larger than the radius of curvature of the at least a portion of the third region R3 in the second cutting plane PL2.

In certain embodiments, the divergence of the second light beam L2 and the third light beam L3 in the second direction D2 can also be reduced. The second light beam L2 and the third light beam L3 are not collimated in the third direction D3. The second surface 10b of the first optical element 10 allows the second light beam L2 and the third light beam L3 to be condensed within the third direction D3.

In the light source module 120, the peak wavelength of the second light beam L2 differs from the peak wavelength of the first light beam L1. The peak wavelength of the third light beam L3 differs from the peak wavelength of the first light beam L1 and differs from the peak wavelength of the second light beam L2. For example, the first light beam L1 is a first-color light beam Lb. The second light beam L2 is, for example, a second-color light beam Lg. The third light beam L3 is, for example, a third-color light beam Lr.

The light source module 120 can be applied to, for example, a projector 210 illustrated in FIG. 5.

Figure 11:
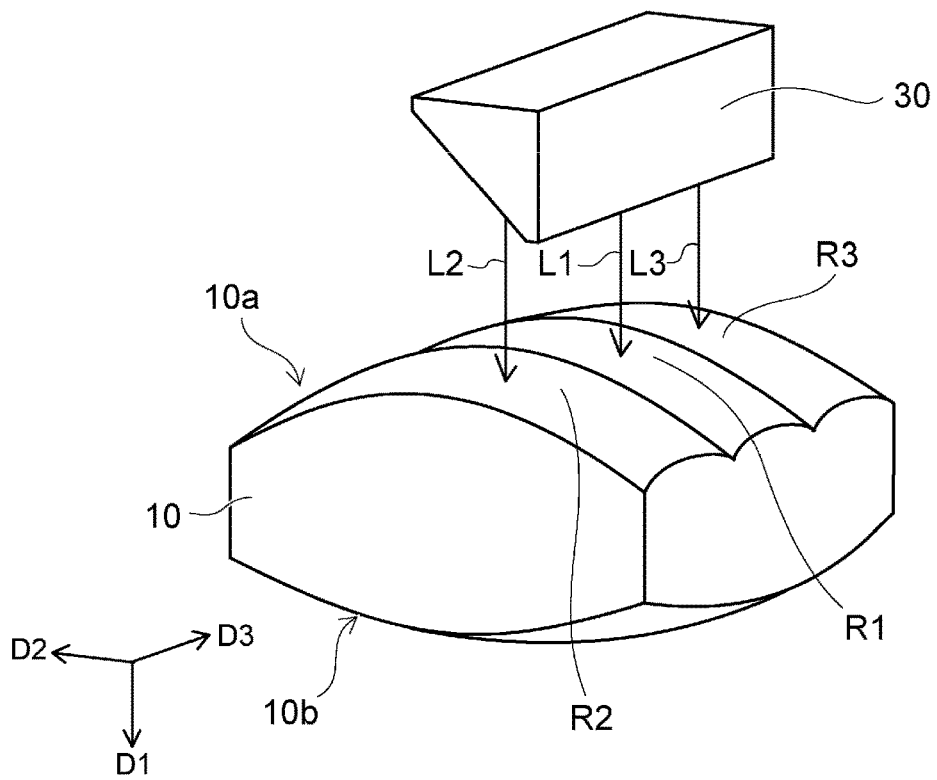
FIG. 11 is a schematic perspective view showing an example of a part of the light source module according to the second embodiment.

FIG. 11 is a schematic perspective view showing a portion of an example of the light source module according to the second embodiment.

As shown in FIG. 11, the first optical element 10 may be disposed near the light source part 30. For example, the distance (such as the shortest distance between the light source part 30 and the first optical element 10) between the light source part 30 and the first optical element 10 may be shorter than the length of the first optical element 10 along the third direction D3. For example, the distance between the light source part 30 and the first optical element 10 as described above may be shorter than the length of the first optical element 10 along the second direction D2. For example, the distance between the light source part 30 and the first optical element 10 may be shorter than the length of the first optical element 10 along the first direction D1. Accordingly, for example, the size of the light source module 120 can be reduced.

An example of the light source part 30 will be described below.

Figure 12:
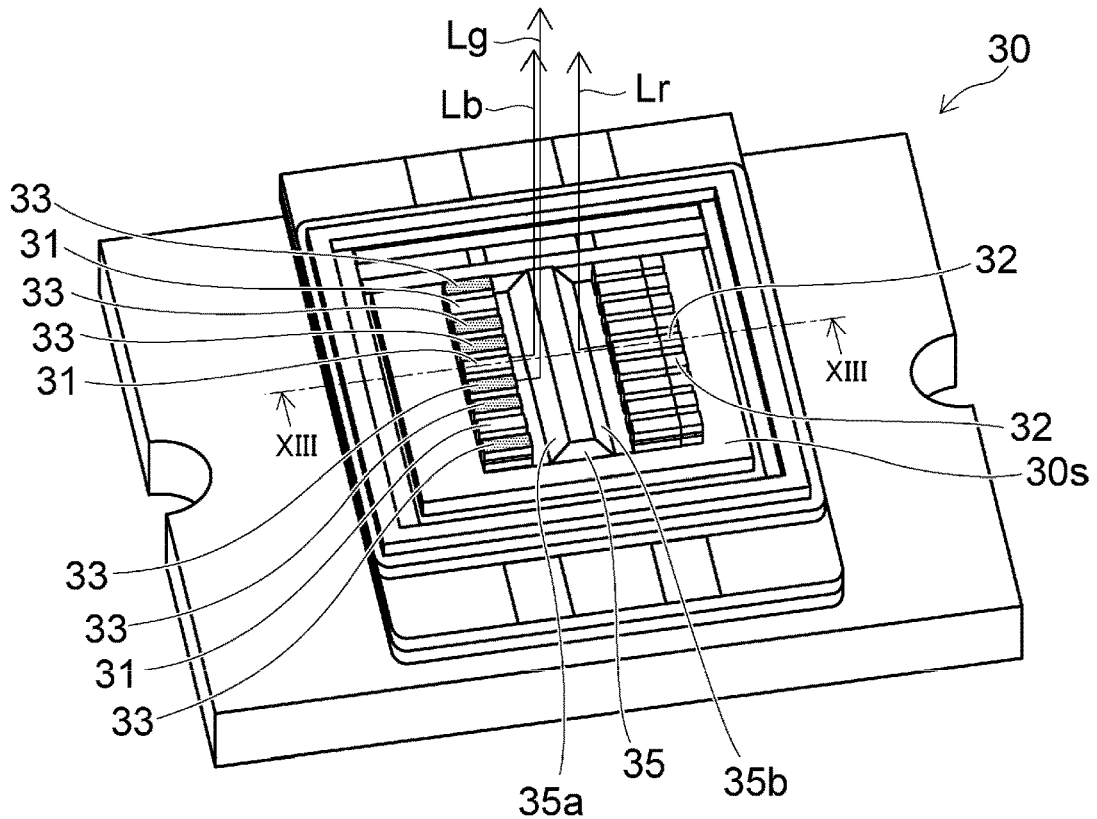
FIG. 12 is a schematic perspective view showing an example of a part of the light source module according to certain embodiments.
Figure 13:
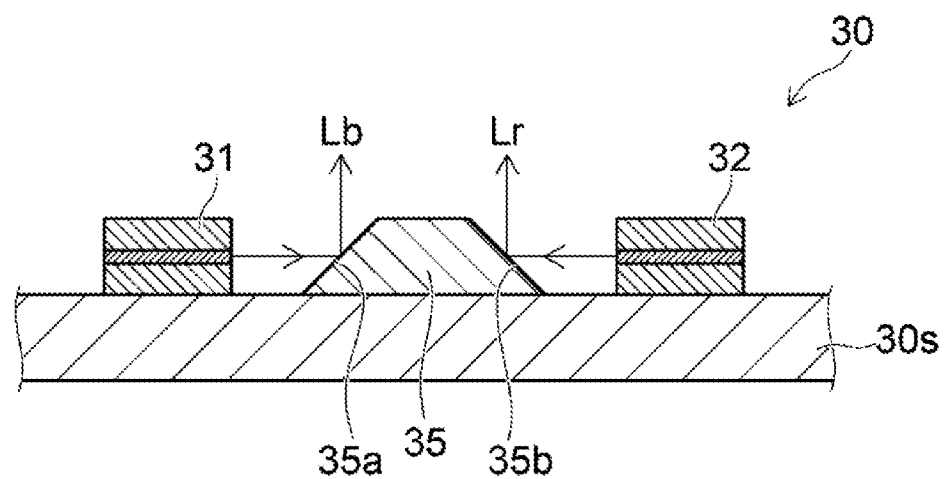
FIG. 13 is a schematic perspective view showing an example of a part of the light source module according to certain embodiments.

FIG. 12 and FIG. 13 are schematic perspective views for illustrating a portion of the light source module according to certain embodiments.

FIG. 12 is a schematic perspective view. FIG. 13 is a schematic cross-sectional view taken along the line XIII-XIII of FIG. 12. The light source part 30 illustrated in FIG. 12 and FIG. 13 can be used for, for example, the light source module 110 or 111.

As shown in FIG. 12, a base member 30s (such as a substrate) is provided with one or more first light sources 31, one or more second light sources 32, one or more third light sources 33, a first reflection surface 35a, and a second reflection surface 35b. In this example, a plurality of first light sources 31, a plurality of second light sources 32, and a plurality of third light sources 33 are disposed. In this example, the second light sources 32 are aligned in a single direction. The single direction is, for example, the third direction D3 (see FIG. 1). In this example, the first light sources 31 and the third light sources 33 are aligned in the single direction.

The first light sources 31 are configured to emit first-color light beams Lb. The second light sources 32 are configured to emit third-color light beams Lr. The third light sources 33 are configured to emit second-color light beams Lg. As described referring to FIG. 6, the light beams may be aligned in the order of "Lg, Lb, Lg, Lg, Lb, Lg, Lg, Lb, and Lg" along a single direction (such as the third direction D3). In this case, the first light sources 31 and the third light sources 33 are aligned in the order of "33, 31, 33, 33, 31, 33, 33, 31, and 33".

The first reflection surface 35*a* is disposed between a first light source 31 (corresponding one or more of the first light sources 31) and a second light source 32 (corresponding one or more of the second light sources 32). A light beam (a first-color light beam Lb in this example) emitted from the first light source 31 is incident on the first reflection surface 35*a*. The light beam emitted from the first light source 31 is, for example, the first light beam L1. In this example, a light beam (a second-color light beam Lg in this example) emitted from a third light source 33 is incident on the first reflection surface 35*a*. The second-color light beam Lg corresponds to the second light beam L2.

The second reflection surface 35*b* is disposed between the first reflection surface 35*a* and a second light source 32 (i.e., one of the second light sources 32). A light beam (a third-color light beam Lr in this example) emitted from the second light source 32 is incident on the second reflection surface 35*b*. The light beam emitted from the second light source 32 is, for example, the fourth light beam L4.

As shown in FIG. 12, a projection 35 is disposed between the first light source 31 and the second light source 32 and between the third light source 33 and the second light source 32. One of two inclined surfaces of the projection 35 is the first reflection surface 35*a*. The other one of the two inclined surfaces of the projection 35 is the second reflection surface 35*b*.

As shown in FIG. 13, for example, a first-color light beam Lb is emitted from the first light source 31 toward the first reflection surface 35*a*. The first-color light beam Lb is reflected by the first reflection surface 35*a* and travels substantially perpendicularly to the main surface of the base member 30*s*. For example, a third-color light beam Lr is emitted from the second light source 32 toward the second reflection surface 35*b*. The third-color light beam Lr is reflected by the second reflection surface 35*b* and travels substantially perpendicularly to the main surface of the base member 30*s*. Similarly, for example, a second-color light beam Lg is emitted from the third light source 33 toward the first reflection surface 35*a* (not shown in FIG. 13). The second-color light beam Lg is reflected by the first reflection surface 35*a* and travels substantially perpendicularly to the main surface of the base member 30*s* (see FIG. 12). The optical axes of these light beams are substantially parallel to one another. Such light beams are incident on the first optical element 10 (see FIG. 1).

The first to third light sources 31 to 33 are, for example, lasers. The first reflection surface 35*a* and the second reflection surface 35*b* are, for example, reflection surfaces of a metal film or a dielectric multilayer film. The incidence angle of the first-color light beam Lb at the first reflection surface 35*a* is in the range of, for example, 40 degrees to 50 degrees. The incidence angle of the second-color light beam Lg at the first reflection surface 35*a* is in the range of, for example, 40 degrees to 50 degrees. The incidence angle of the third-color light beam Lr at the second reflection surface 35*b* is in the range of, for example, 40 degrees to 50 degrees.

For example, in the light source module 120 illustrated in FIG. 9 and other drawings, the light source part 30 has the first reflection surface 35*a* illustrated in FIG. 12 and FIG. 13, and illustration of the second reflection surface 35*b* is omitted. The first light beam L1 is emitted from one of a plurality of light sources (such as the first light sources 31 and the third light sources 33). The second light beam L2 is emitted from another one of the plurality of light sources.

The third light beam L3 is emitted from further another one of the plurality of light sources.

For example, glass or a plastic is used for the first optical element 10 and the second optical element 20 in the first embodiment and the second embodiment. Reflection of light beams in the second optical element 20 may be, for example, total reflection according to the difference in refractive indices. Reflection of light beams in the second optical element 20 may be, for example, mirror reflection.

In the first and second embodiments, the light source part 30 is configured to emit one or a plurality of light beams. The light beams are emitted in the same direction (such as the first direction D1). In an example of the first embodiment, respective two or more light sources of the plurality of light sources may be configured to emit light beams with a respective one of different wavelengths (such as blue, green, and red). These light sources are, for example, lasers. The major axis directions (such as the slow axis directions) of the far field patterns of the light beams emitted from the light sources are substantially parallel to each other. In an example of the first embodiment, the peak wavelength of a light beam incident on the first region R1 differs from the peak wavelength of a light beam incident on the fourth region R4. The positions of the first region R1 and the fourth region R4 are substantially symmetric about the central axis of the first optical element 10.

Also in an example of the second embodiment, the major axis directions (such as the slow axis directions) of the far field patterns of the light beams emitted from the light sources (such as lasers) are substantially parallel to each other. The light beams are aligned along a minor axis direction (such as the fast axis direction) of the far field pattern.

The incidence surface (the first surface 10*a*) of the first optical element 10 includes a plurality of regions corresponding respectively to a plurality of light beams. The first optical element 10 has an emission surface (the second surface 10*b*) that includes a lens having a light-condensing function. In an example, at least one lens on the first surface 10*a* has a shape of a convex lens having a collimating function in the fast axis direction. The at least one lens has a shape of at least one of a concave lens, a straight line, and a convex lens other than the collimating function in the slow axis direction.

The second optical element 20 (such as a rod lens) has an incident end (the first end 20*a*) of located near the focal point of an emission surface (the second surface 10*b*) of the first optical element 10.

According to certain embodiments, a light source module having a uniform light intensity distribution can be obtained.

In the specification of the present application, the expressions "perpendicular" and "parallel" refer to not only a strictly perpendicular configuration and a strictly parallel configuration, but also include, for example, a configuration slightly deviated from a strictly perpendicular configuration and a configuration slightly deviated from a strictly parallel configuration due to manufacturing processes, etc. That is, the terms "perpendicular" and "parallel" encompass substantially perpendicular and substantially parallel configurations, respectively.

Certain embodiments of the present invention have been described above referring to specific examples. However, the scope of the present invention is not limited to those specific examples. For example, specific structures of the light source, the light sources, the reflection surfaces, the optical elements, and the mirrors included in the light source module may be appropriately selected from known art by a person skilled in the art, and variations of such specific configurations are within the scope of the present invention as long as a person skilled in the art can implement the present invention in a similar manner and can obtain similar effects.

Further, two or more elements, combined to the extent technical possible, in the specific examples are also within the scope of the present invention as long as the combination of the two or more elements involves the gist of the present invention.

Further, all light source modules that can be obtained through appropriate changes in design made by a person skilled in the art on the basis of the light source module described above in certain embodiments of the present invention are within the scope of the present invention as long as the light source modules involve the gist of the present invention.

Various modifications and variations can be made by a person skilled in the art within the idea of the present invention. Therefore, those variations and modifications also fall within the scope of the present invention.

What is claimed is:

1. A light source module comprising:
  a light source part configured to emit a first light beam;
  a first optical element having:
    a first surface on which the first light beam is incident along a first direction, the first surface including a first region on which at least a portion of the first light beam is incident, and
    a second surface from which the first light beam is emitted; and
  a second optical element having a first end on which the first light beam having been emitted from the first optical element is incident, wherein
  the first light beam has:
    a first width along a second direction intersecting the first direction on the first surface, and
    a second width along a third direction intersecting a plane comprising the first direction and the second direction on the first surface,
  the first width is greater than the second width,
  the first region has a convex shape in a first cutting plane comprising the first direction and the second direction, and has a concave shape in a second cutting plane comprising the first direction and the third direction, and
  the second surface has a convex shape in the first cutting plane and in the second cutting plane, and
  the first region collimates the first light beam in the second direction, without collimating the first light beam in the third direction.

2. The light source module according to claim 1, wherein
  the light source part is further configured to emit an additional light beam,
  the additional light beam is incident on the first surface along the first direction,
  the additional light beam has a width along the second direction on the first surface and a fourth width along the third direction on the first surface,
  the width along the second direction is greater than the fourth width along the third direction,
  the first surface comprises an additional region on which at least a portion of the additional light beam is incident,
  a direction from the additional region to the first region lies along the third direction,
  the additional region has a convex shape in another cutting plane comprising the first direction and the second direction, and has a concave shape in the second cutting plane.

3. The light source module according to claim 1, wherein
  the light source part is further configured to emit a second light beam,
  the second light beam is incident on the first surface along the first direction,
  the second light beam has a third width along the second direction on the first surface and a fourth width along the third direction on the first surface,
  the third width is greater than the fourth width,
  the first surface comprises a second region on which at least part of the second light beam is incident,
  the second region has a convex shape in a third cutting plane comprising the first direction and the second direction,
  a direction from the second region to the first region lies along the third direction, and
  a radius of curvature of the second region in the third cutting plane is smaller than a radius of curvature of the second region in the second cutting plane.

4. The light source module according to claim 1, wherein
  the light source part is further configured to emit a fourth light beam,
  the fourth light beam is incident on the first surface along the first direction,
  the fourth light beam has a seventh width along the second direction on the first surface and an eighth width along the third direction on the first surface,
  the seventh width is greater than the eighth width,
  the first surface comprises a fourth region on which at least a portion of the fourth light beam is incident,
  a direction from the fourth region to the first region intersects a plane comprising the first direction and the third direction,
  the fourth region has a protruding shape in a fifth cutting plane comprising the first direction and the second direction, and has a recessed shape in a sixth cutting plane comprising the first direction and the third direction.

5. The light source module according to claim 1, wherein
  the second optical element further has a second end,
  the first light beam incident on the first end is emitted from the second end, and
  a length along a direction from the first end to the second end of the second optical element is longer than a length along a direction intersecting the direction from the first end to the second end of the second optical element.

6. The light source module according to claim 1, wherein the light source part comprises:
  a first light source;
  a second light source;
  a first reflection surface on which a light beam emitted from the first light source is incident, the first reflection surface being located between the first light source and the second light source; and
  a second reflection surface on which a light beam emitted from the second light source is incident, the second reflection surface being located between the first reflection surface and the second light source.

7. The light source module according to claim 3, wherein at least a portion of the second region forms a straight line in the second cutting plane.

8. The light source module according to claim 3,
the light source part is further configured to emit a third light beam,
the third light beam is incident on the first surface along the first direction,
the third light beam has a fifth width along the second direction on the first surface and a sixth width along the third direction on the first surface,
the fifth width is greater than the sixth width,
the first surface comprises a third region on which at least a portion of the third light beam is incident,
the first region is located between the second region and the third region in the third direction,
the third region has a protruding shape in a fourth cutting plane comprising the first direction and the second direction, and
a radius of curvature of the third region in the fourth cutting plane is smaller than a radius of curvature of the third region in the second cutting plane.

9. The light source module according to claim 3, wherein the first light beam and the second light beam are laser beams.

10. The light source module according to claim 4, wherein an absolute value of an angle defined by the direction from the fourth region to the first region and the second direction is 30 degrees or less.

11. The light source module according to claim 4, wherein
the light source part is further configured to emit a fifth light beam,
the fifth light beam is incident on the first surface along the first direction,
the fifth light beam has a ninth width along the second direction on the first surface and a tenth width along the third direction on the first surface,
the ninth width is greater than the tenth width,
the first surface comprises a fifth region on which at least a portion of the fifth light beam is incident,
a direction from the fifth region to the fourth region lies along the third direction,
the fifth region has a protruding shape in a seventh cutting plane comprising the first direction and the second direction, and
a radius of curvature of the fifth region in the seventh cutting plane is smaller than a radius of curvature of the fifth region in the sixth cutting plane.

12. The light source module according to claim 8, wherein
the second light beam has a peak wavelength different from a peak wavelength of the first light beam, and
a difference between a peak wavelength of the third light beam and the peak wavelength of the second light beam is smaller than a difference between the peak wavelength of the second light beam and the peak wavelength of the first light beam.

13. The light source module according to claim 8, wherein a peak wavelength of the second light beam and a peak wavelength of the third light beam are respectively substantially the same as a peak wavelength of the first light beam.

14. The light source module according to claim 8, wherein
the light source part is further configured to emit a fourth light beam,
the fourth light beam is incident on the first surface along the first direction,
the fourth light beam has a seventh width along the second direction on the first surface and an eighth width along the third direction on the first surface,
the seventh width is greater than the eighth width,
the first surface comprises a fourth region on which at least a portion of the fourth light beam is incident,
a direction from the fourth region to the first region intersects a plane comprising the first direction and the third direction,
the fourth region has a protruding shape in a fifth cutting plane comprising the first direction and the second direction, and has a recessed shape in a sixth cutting plane comprising the first direction and the third direction.

15. The light source module according to claim 11, wherein
the light source part is further configured to emit a sixth light beam,
the sixth light beam is incident on the first surface along the first direction,
the sixth light beam has an eleventh width along the second direction on the first surface and a twelfth width along the third direction on the first surface,
the eleventh width is greater than the twelfth width,
the first surface comprises a sixth region on which at least a portion of the sixth light beam is incident,
the fourth region is located between the fifth region and the sixth region in the third direction,
the sixth region has a protruding shape in an eighth cutting plane comprising the first direction and the second direction, and
a radius of curvature of the sixth region in the eighth cutting plane is smaller than a radius of curvature of the sixth region in the sixth cutting plane.

16. A light source module comprising:
a light source part configured to emit a first light beam;
a first optical element having:
a first surface on which the first light beam is incident, the first surface comprising a first region on which at least a portion of the first light beam is incident, and
a second surface from which the first light beam is to be emitted; and
a second optical element having a first end on which the first light beam having emitted from the second surface is incident, wherein
the first light beam is incident on the first surface along a first direction,
the first light beam has:
a first width along a second direction intersecting the first direction on the first surface, and
a second width along a third direction intersecting a plane comprising the first direction and the second direction on the first surface,
the first width is greater than the second width,
at least a portion of the first region has a convex shape in a first cutting plane comprising the first direction and the second direction and in a second cutting plane comprising the first direction and the third direction,
the second surface has a convex shape in the first cutting plane and in the second cutting plane,
a radius of curvature of the at least a portion of the first region in the first cutting plane is larger than a radius of curvature of the at least a portion of the first region in the second cutting plane, and
the first region collimates the first light beam in the second direction, without collimating the first light beam in the third direction.

17. The light source module according to claim 16, wherein
the light source part is further configured to emit a second light beam having a second peak wavelength different from a first peak wavelength of the first light beam,
the second light beam is incident on the first surface along the first direction and is emitted from the second surface,
the second light beam having been emitted from the second surface is incident on the first end,
the second light beam has:
a third width along the second direction on the first surface, and
a fourth width along the third direction on the first surface,
the first width is greater than the second width,
the first surface comprises a second region on which at least a portion of the second light beam is incident,
a direction from the second region to the first region lies along the third direction,
at least a portion of the second region has a protruding shape in a third cutting plane comprising the first direction and the second direction and in the second cutting plane, and
a radius of curvature of the at least part of the second region in the third cutting plane is larger than a radius of curvature of the at least part of the second region in the second cutting plane.

18. The light source module according to claim 16, wherein
the second optical element further has a second end,
the first light beam incident on the first end is emitted from the second end, and
a length along a direction from the first end to the second end of the second optical element is longer than a length along a direction intersecting the direction from the first end to the second end of the second optical element.

19. The light source module according to claim 16, wherein the light source part comprises:
a first light source;
a second light source;
a first reflection surface on which a light beam emitted from the first light source is incident, the first reflection surface being located between the first light source and the second light source; and
a second reflection surface on which a light beam emitted from the second light source is incident, the second reflection surface being located between the first reflection surface and the second light source.

20. The light source module according to claim 17, wherein the first light beam and the second light beam are laser beams.

* * * * *